(12) United States Patent
Farlow et al.

(10) Patent No.: US 7,311,302 B1
(45) Date of Patent: Dec. 25, 2007

(54) SUBSTRATE SUPPORT SYSTEM

(75) Inventors: Douglas T. Farlow, San Diego, CA (US); Thomas A. Gordon, Round Rock, TX (US)

(73) Assignee: Production Solutions, Inc., Poway, CA (US)

( * ) Notice: Subject to any disclaimer, the term of this patent is extended or adjusted under 35 U.S.C. 154(b) by 0 days.

(21) Appl. No.: 11/535,030

(22) Filed: Sep. 25, 2006

(51) Int. Cl.
*B23Q 3/00* (2006.01)
(52) U.S. Cl. ........................ 269/296; 269/21
(58) Field of Classification Search .............. 269/296, 269/21, 266, 309
See application file for complete search history.

(56) References Cited

U.S. PATENT DOCUMENTS

| 4,805,887 | A | * | 2/1989 | Ray ............................ 269/21 |
| 5,984,293 | A | * | 11/1999 | Abrahamson et al. ...... 269/266 |
| 6,264,187 | B1 | * | 7/2001 | Hertz et al. ................. 269/266 |
| 6,695,298 | B1 | * | 2/2004 | Hertz et al. ................. 269/266 |

* cited by examiner

*Primary Examiner*—Lee D. Wilson
(74) *Attorney, Agent, or Firm*—Sierra Patent Group, Ltd.

(57) ABSTRACT

An improved substrate support system for clamping spring loaded pins that support substrates, such as printed circuit boards, which have even profiles, and uneven profiles due to components being installed on one side during manufacturing operations to the opposite side of the substrate. The substrate support system can utilize a cam lever, a knob, or a draw latch to move a clamping plate between an aligned position and a clamping position.

24 Claims, 11 Drawing Sheets

SUBSTRATE SUPPORT SYSTEM

FIELD OF THE INVENTION

The present invention relates to an apparatus for supporting a printed circuit board or other substrate typically having components mounted on one side during installation of other components on the opposite side.

BACKGROUND OF THE INVENTION

Printed circuit boards (PCB) have long been used as the base for sophisticated electronic systems. An electrically insulating sheet, originally phenolic impregnated fabrics and now generally fiberglass reinforced resins, is coated with copper cladding and has appropriate patterns etched into the cladding. In years past, most electronic components had wire leads that extended through holes drilled into the cladding pattern and filled with solder to make the required connections. More recently, surface bonding of relatively short leads to the cladding has become common, allowing for high-speed robotic placement of components.

Today, electronic devices are increasingly miniaturized and it has become desirable to mount component on both sides of a PCB. However, there are a number of problems associated with installing parts on the second side after components have been mounted on the first side. The board cannot be held flat with downwardly projecting components of various sizes and thicknesses mounted on the lower side. This problem is most acute when solder paste is to be printed on the second side. Holding the PCB flat and level under a paste application stencil during solder paste application and then during component placement is very difficult.

In high production run circumstances, aluminum plates or similar materials have been machined out in a pattern corresponding to the topography of the first side of the PCB with components installed. This approach is not practical for manufactures or subcontractors producing a limited quantity of a very great number of PCB configurations, each requiring its own "hogged-out" support plate.

Supports have also been made by casting a plaster-like material into a mold corresponding to a particular PCB to form a support having pockets for receiving the components on the downwardly extending board side.

While effective where a large number of identical boards are to be manufactured, these methods are not cost effective where only a few boards are to be made or where custom boards are being manufactured.

A number of different devices having a plurality of adjustable length upstanding fingers have been developed to support an irregularly shaped article. Typical of these devices is the device for supporting parts during machining as described by Barozzi in U.S. Pat. No. 4,936,560, the casting support device describe by Godding in U.S. Pat. No. 4,200,272, and the core support system described by Bourassa et al. in the U.S. Pat. No. 3,530,994.

While these supports are generally effective for their intended purposes, they are overly complex, and do not always provide positive support across the supported object.

A circuit board support system using a plurality of spaced-apart, parallel, upwardly extending pistons is described by Fadiga et al. in U.S. Pat. No. 3,942,778. This support is used to press the back of the boards against test sensors. Since the pistons are not lockable to match a particular PCB, each succeeding board must be pressed down against the pistons, risking damage. Further, the system is not readily useful in installing components on the back of the board, since the pistons continue to press upwardly so that the board may not lie truly flat and may move during back-side component installation.

Thus, there is a continuing need for improved supports for holding a substrate, such as a printed circuit board, having components mounted on one side while additional components are installed on the opposite side, that will support the board in a precisely level position, that will provide strong, consistent support for the board during second surface stencil printing and soldering operations, that can easily be locked in the support position appropriate to a series of similarly configured boards, that precisely indexes board edges and that is easily unlocked and reconfigured for other boards.

U.S. Pat. No. 5,897,108 describes a series of plates with aligned holes through which spring loaded pins protrude. A top and bottom plate hold the pins in position laterally, while a middle plate is moved out of alignment to clamp the pins, holding the pins in vertical alignment to the underside topology of the substrate.

U.S. Pat. No. 5,897,108 further describes a means for moving the middle plate out of alignment, and then describes two ways to do so.

The first way is to move the middle plate by applying force against the edge of the middle plate with screws. Typically, one of the middle plate's edges protrudes out further than the edges of the top and bottom plates while the pin holes are in alignment. Screws can then be placed through the frame that surrounds the three plates. The screws push against the middle plate's edge and move it out of alignment. While this method is simple, it will eventually permanently deform the middle plate at the point where force is applied.

The preferred way described in U.S. Pat. No. 5,897,108 is to use a cam, which uses holes in the top and bottom plates to anchor the cam at its ends. The cam's lobe is then pushed against the middle plate, thereby moving it out of alignment when the cam is rotated. This method is not as robust as it could be, in that the anchor points of the cam wear easily because the plates are very thin (typically 0.048" thick) and made from aluminum.

FIGS. 1-3B illustrate a version of U.S. Pat. No. 5,897,108 that is currently used. It should be noted that while the patent shows a system with a wide array of pins, the units can be made in strips 2, typically three pins wide, having front-end rail 4, rear-end rail 6, and side rails 8. The strips 2 are then stacked next to each other to make up wider arrays as manufacturing operations, machine conditions and substrate size dictate (compare the first figure of the patent with FIG. 1 of the current method).

While this version still uses a cam 28, it no longer uses the top and bottom plates 22 and 18 as anchor points. Instead, a cam slot retainer (the cam receptacle) 32 is anchored to the middle (clamping) plate 20 with four screws 38. One end of the cam is then fixed with a cam block housing (the cam hub) 24, which in turn is anchored to the very bottom (base) plate 10 of the system. The cam block housing's position can be adjusted back and forth with an adjustment screw 26, and four screws 40 then hold the block in position to the bottom, as seen in FIGS. 2 and 3. Elastically compressible elements, such as pin springs 14, are positioned in recesses formed in base plate 10 and preferably separated by plastic insert plates 12. These compressible elements exert an upwardly directed biasing force on pins 16, which protrude through the apertures 36 in the bottom, middle and top plates. With the cam's hub 24 anchored at the base 10, the cam lobe rotates inside the cam slot retainer 32, which in turn moves the middle plate 20 out of alignment, thereby distorting and locking pins 16 in position. A T-handle Allen wrench 34 is used to engage the cam 28 and rotate it to its locked and unlocked positions.

There are also two plate return springs 30 that push against the front-end rail 4 and the cam slot retainer 32. When the pins 16 are unlocked by rotating the cam 28 to the unlocked position, the middle plate 20 is moved to its aligned position relative to the top and bottom plates 22 and 18 with the help of the springs 30. The cam slot retainer 32 was designed, not as a true cam receptacle (although it could have been, thus alleviating the need for the springs), but to have some "slop" built in to allow for manufacturing tolerances in the system. The springs 30 are therefore necessary to help the middle plate 20 to return to an aligned position. In addition, the pins 16, being made of an elastic material, help move the middle plate 20 to its aligned position when the plate is unlocked, but the springs 30 are used to finish the movement.

Not shown in the figures is a ball plunger that goes through the front-end rail 4 and screws into the cam slot retainer 32, pressing against the cam 28. The cam 28 has a dimple in its side so that when the cam 28 is in the locked position, the plunger engages the detent and keeps the cam 28 in the locked position.

The cam 28, the cam slot retainer 32 and the cam block housing 24 are expensive to manufacture (approximately $44.00 per unit). Furthermore, additional tooling is required (the Allen wrench—a $3.00 item). The present invention provides simpler methods, equally robust, which improve on the patented and current methods of manufacture.

SUMMARY

The present invention provides an improved method for clamping spring loaded pins that support substrates, such as printed circuit boards, which have even profiles, and uneven profiles due to components being installed on one side, during manufacturing operations to the opposite side of the substrate. Typically, the substrate needs support to prevent flexing during manufacturing operations such as solder paste printing, pick-and-place operations, and any other operation where it is desirable to keep the substrate from flexing.

In accordance with one aspect of the present invention, an apparatus for supporting a substrate is disclosed comprising a first plate having a plurality of recess positions formed in a predetermined pattern. An elastically compressible element is positioned in at least some of the first plate recess positions. A second plate is disposed above the first plate and has a plurality of uniform apertures in a pattern corresponding to the predetermined recess pattern. A third plate overlies the second plate and has a plurality of uniform apertures in a pattern corresponding to the second plate aperture pattern. A fourth plate overlies the third plate and has a plurality of uniform apertures in a pattern corresponding to the second plate aperture pattern. A plurality of deformable pins is provided for insertion into at least some of the apertures in the second, third and fourth plates when the apertures are aligned. The pins have cross sections corresponding to the second, third and fourth plate apertures. An anchor block is secured to the third plate. Means are provided for moving the third plate between an aligned position in which the apertures in the second, third and fourth plates are aligned and a clamping position in which the third plate is not aligned with the second and fourth plate apertures. The means for moving the third plate is configured to move the third plate to the clamping position by translating the anchor block in a horizontal direction. The means for moving the third plate may comprise such mechanisms as a cam lever, a knob or a draw latch.

DETAILED DESCRIPTION

Persons of ordinary skill in the art will realize that the following disclosure is illustrative only and not in any way limiting. Other embodiments of the invention will readily suggest themselves to such skilled persons having the benefit of this disclosure.

Figure 1:
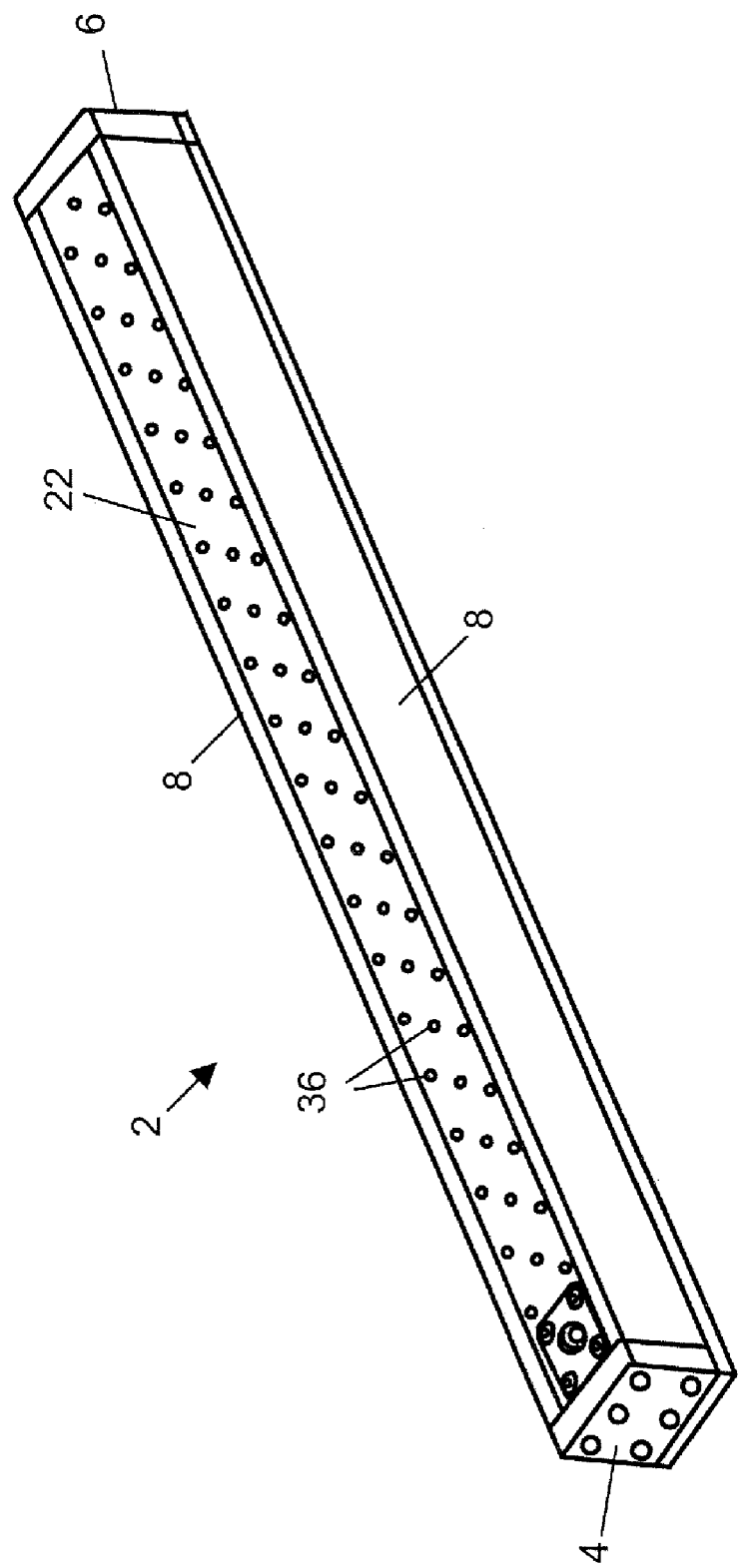
FIG. 1 is a perspective view of a current version of a substrate support system.
Figure 2:
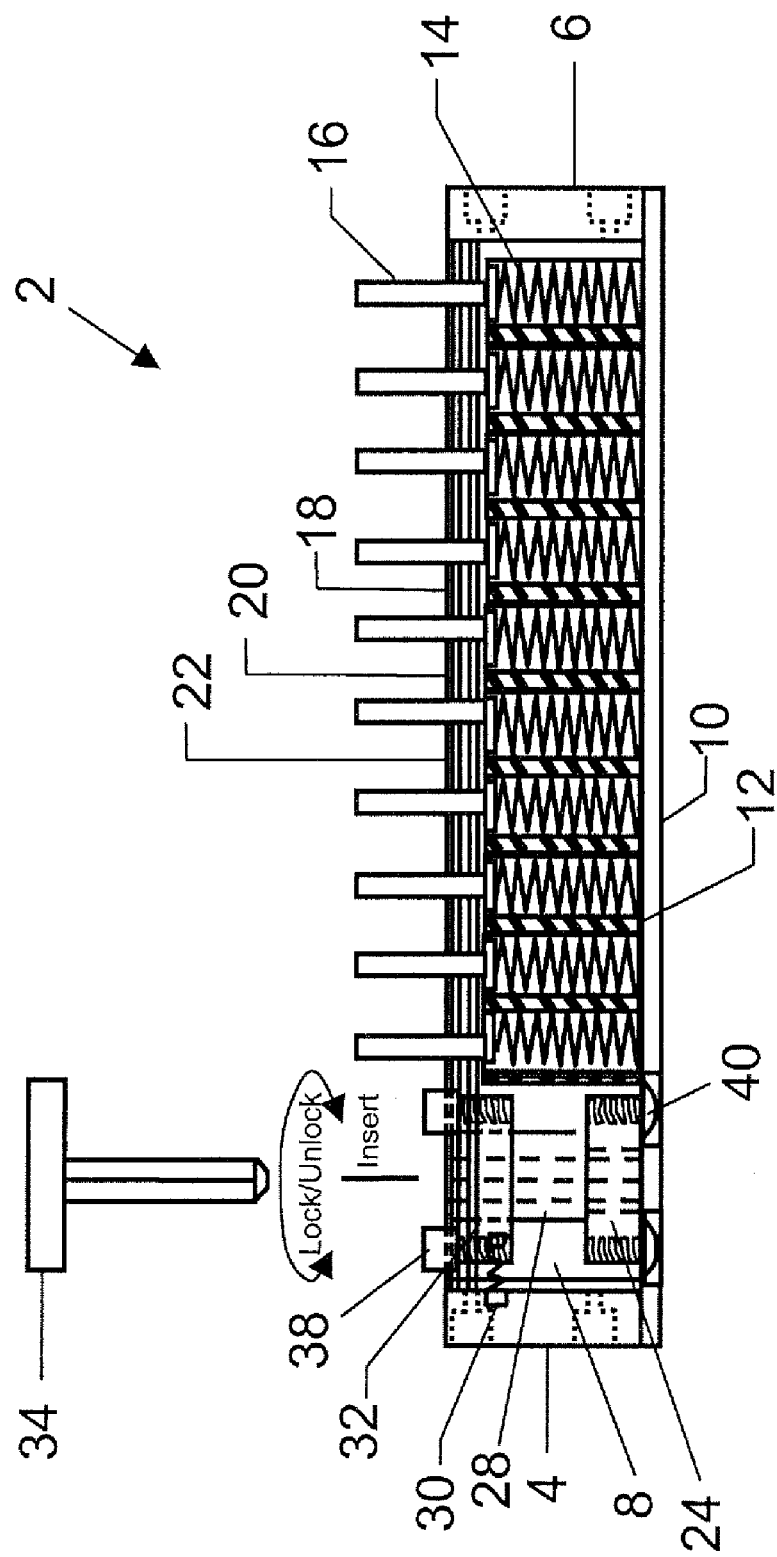
FIG. 2 is a cross-sectional view of the substrate support system of FIG. 1.
Figure 3:
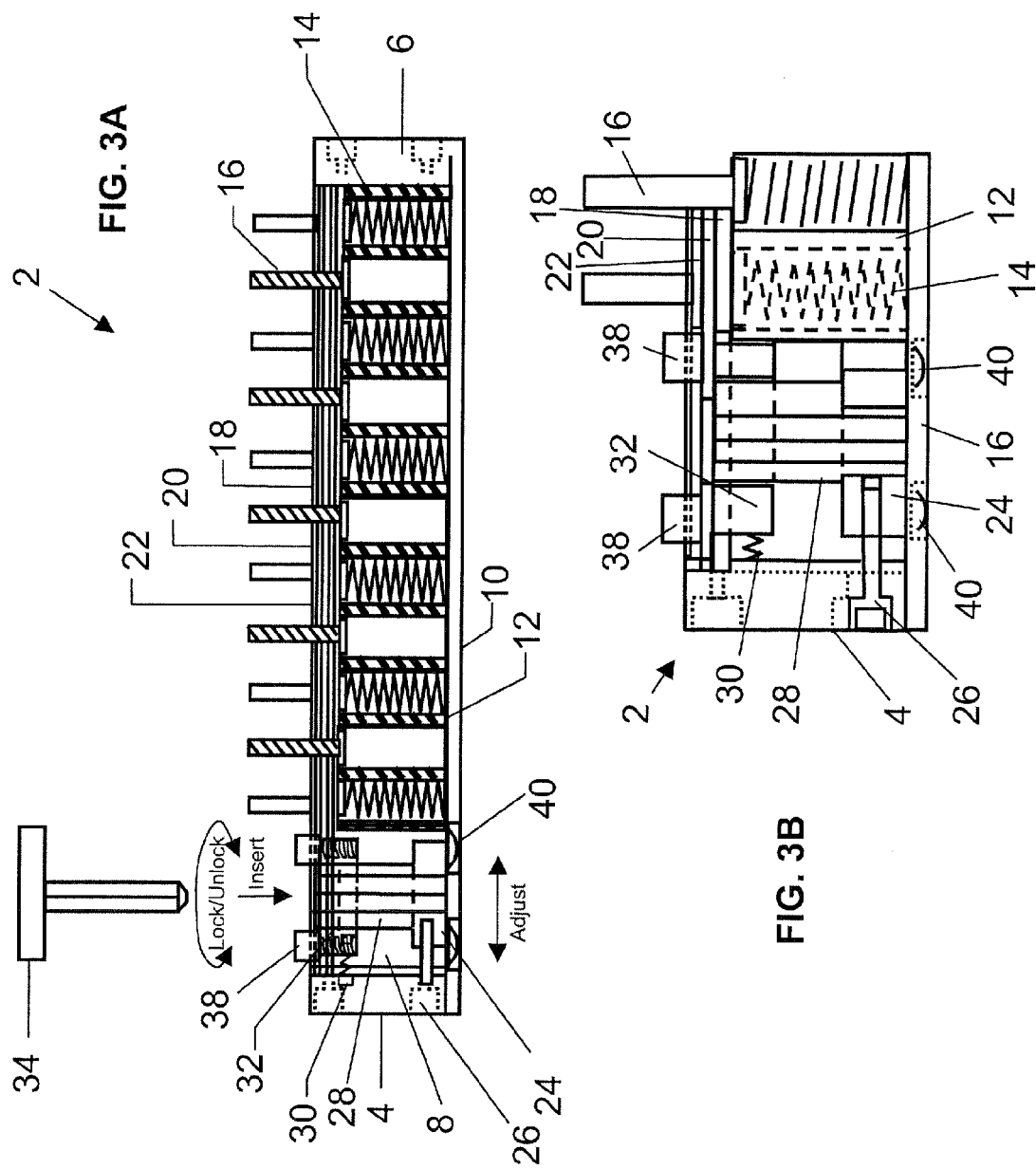
FIG. 3A is another cross-sectional view of the substrate support system of FIG. 1.
FIG. 3B is a close-up cross-sectional view of the substrate support system of FIG. 3A.
Figure 4:
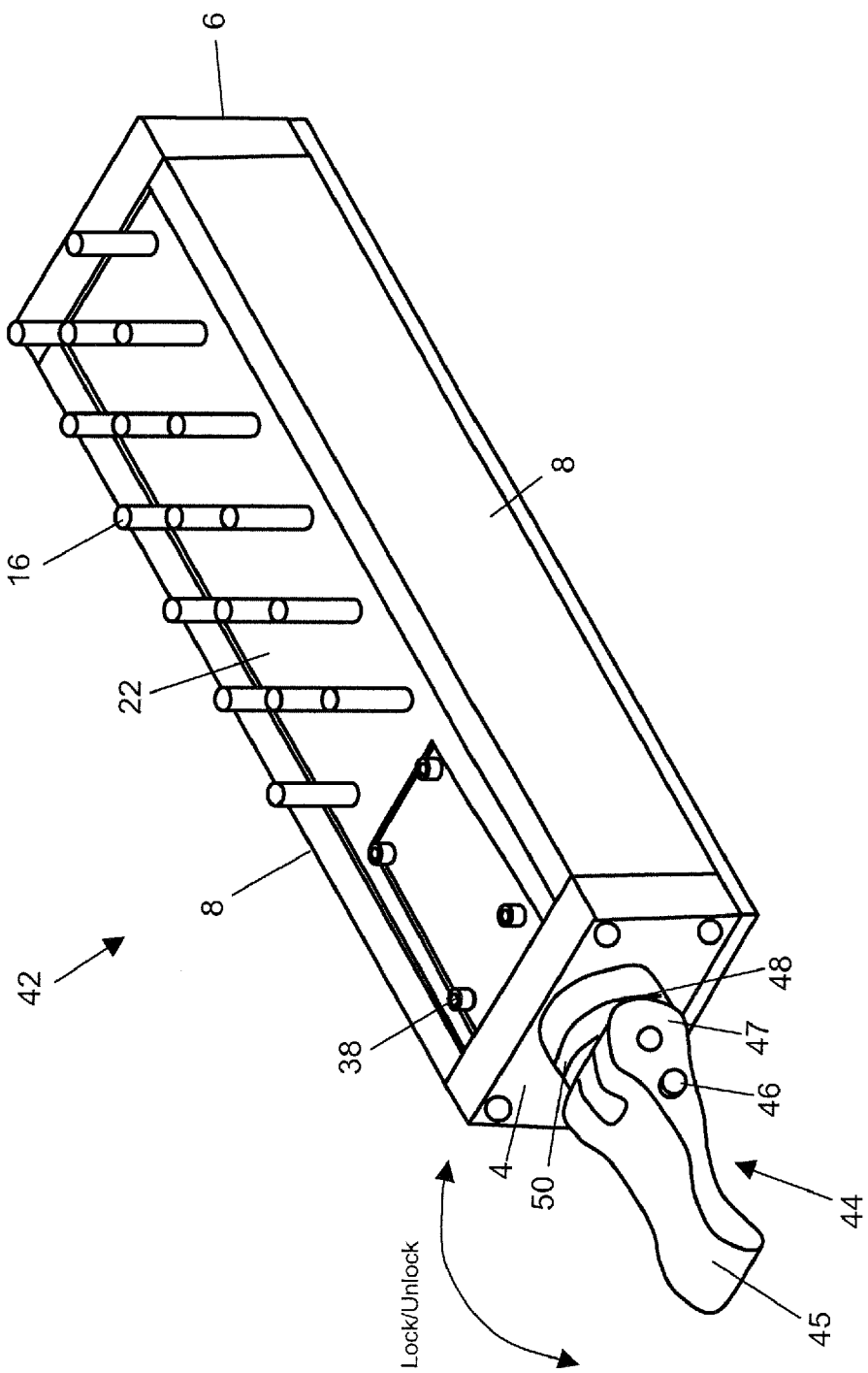
FIG. 4 is a perspective view of one embodiment of a substrate support system in accordance with the present invention.
Figure 5:
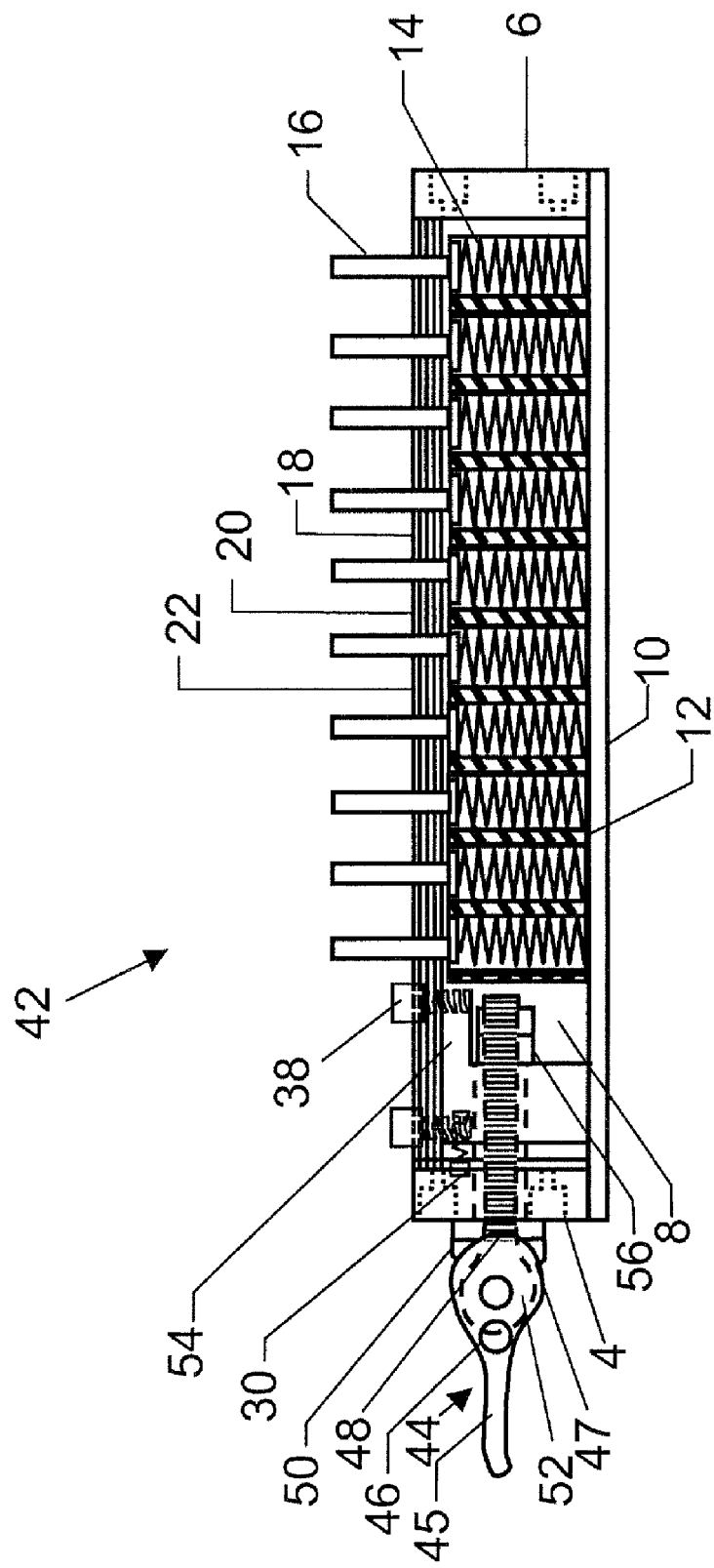
FIG. 5 is a cross-sectional view of the substrate support system of FIG. 4.

FIGS. 4-5 illustrate a substrate support system 42 for supporting PCB's having components installed on one surface while installing other components on the opposite surface. If desired, a PCB with no installed components may also be supported.

Substrate support system 42 comprises elastically compressible members 14 positioned on base plate 10. Base plate 10 is configured to receive and maintain the lateral position of members 14 in a plurality of recess positions. These recess positions can be achieved in a variety of ways, such as disposing insert plates 12 between members 14, as seen in FIG. 5, and/or by forming simple recesses in base plate 10. In a preferred embodiment, insert plates 12 are formed from plastic. However, it is contemplated that other materials may be suitable to form insert plates 12 as well. If desired, recesses may be integrally formed in base plate 10 by molding, machining or the like. Elastically compressible members 14 may be any suitable material that exerts an upwardly directed biasing force when compressed. Resilient foamed plastics and metal or plastic springs are preferred. For best results, members 14 are conical or frusto-conical compression springs having a base that substantially fills the bottom surface of the enclosed space created by insert plates 12 or recesses in base plate 10 and a relatively narrow peak.

Substrate support system 42 also comprises a plurality of plates sandwiched together. These plates include a bottom plate 18, a middle clamping plate 20 and a top plate 22. In a preferred embodiment, front-end rail 4, rear-end rail 6 and side rails 8 are secured to base plate 10 to form a frame around the periphery bottom plate 18, middle plate 20, top plate 22, and the components disposed between bottom plate 18 and base plate 10. Front-end rail 4, rear-end rail 6 and side rails 8 may be secured to base plate 10 by any suitable manner known in the art, such as by adhesive bonding, soldering, threaded fasteners, etc.

Bottom plate 18 is disposed above elastically compressible members 14 and may be supported by insert plate 12. Bottom plate 18 includes a pattern of apertures having axes corresponding to the axes of compressible members 14, respectively. These apertures are preferably somewhat narrower than compressible members 14. Middle plate 20 overlies bottom plate 18 and has a surface pattern of apertures substantially identical to the pattern of apertures in bottom plate 18. Top plate 22 overlies middle plate 20 and has a surface pattern of apertures substantially identical to the pattern of apertures in bottom plate 18 and middle plate 20. In a preferred embodiment, the apertures in the bottom, middle, and top plates are substantially equal in diameter and smaller in diameter than the elastically compressible members 14. Bottom plate 18 and top plate 22 may be secured to the frame created by rails 4, 6 and 8.

Deformable pins 16, such as rubber-like pins, are inserted in the aligned apertures through plates 18, 20 and 22. Pins 16 may be formed from any suitable material having the desired friction characteristics. Excellent results are obtained with hard rubber pins, nylon pins or other harder plastics, where the harder materials have circumferential or longitudinal shallow surface grooves or serrations. In a preferred embodiment, pins 16 are formed from a slightly deformable material having a hardness in the 75 to 90 range on the Shore A scale.

The lower ends of pins 16 rest against springs 14. A PCB having components installed on one side is pressed against the array of pins 16, with components pushing pins 16 downwardly against springs 14 distances corresponding to the thickness of the components. If desired, a PCB with no components installed can also be placed over the array of pins 16 for installation of components on the upper side. The PCB could, of course, comprise any suitable substrate upon which components are to be mounted in any manner.

System 42 employs cam lever 44 to move middle plate 20 into and out of alignment with the corresponding apertures in adjacent second bottom plate 18 and top plate 22, in order to lock and unlock the position of pins 16. Cam levers 44 can be obtained off the shelf for less than $5.00 each. The levers 44 preferably have a threaded pin 52 that can be anchored to a cam pin anchor block 54, which is disposed within the rail frame, after passing through front-end rail 4. The cam pin anchor block 54 is anchored to the middle plate 20. The cam pin block 54 may be secured to the middle plate 20 by any means known in the art, such as threaded fasteners 38. The portion of cam pin block 54 through which cam lever pin 52 passes can be threaded. However, the cam lever 44 would then have to be fixed in position such that the cam pin 52 could not be further tightened or loosened beyond a certain point. Such a design maintains the middle plate's unaligned "throw" at a constant distance (typically only 0.035" to 0.050"). This configuration can be accomplished by fixing the cam lobe retainer 50 in place, or by placing a flat washer on the threaded cam pin 52 and putting a set screw through the cam pin block 54 down to the flat washer on the cam pin 52. In this fashion, the cam lever 44 may be prevented from rotating beyond a certain point.

Although cam lobe retainer 50 is shown in the figures as conforming to the cam lever's lobe 47, it could be as simple as a flat washer made from a material such as Teflon, nylon or plastic. This design keeps the cam lobe 47 and the outside surface of the front-end rail 4 from wearing.

The cam pin block 54 may also have a non-threaded hole through which the cam pin 52 passes. The pin 52 would then have retainer nuts 56 applied at its end after pin 52 passes through cam pin block 54. Two nuts 56 could be used to secure the pin 52 at a specific distance, thereby allowing the cam lever 44 to swivel freely while keeping the middle plate throw distance constant.

The cam lever's lobe 47 may be configured such that cam lever 44 is locked when the lever arm 45 is perpendicular to the unit or parallel to the unit. Parallel is the preferred locking position since the parallel lever 44 would not interfere with other units when the strips are stacked next to each other.

The cam lever 44 can also have a simple spring-loaded lock button 46 that when depressed allows the lever 44 to move freely. In the lock position, the lock button 46 engages the cam pin 52 and prevents the lever 44 from being moved unless the button 46 is depressed. As would be appreciated by one ordinarily skilled in the art, these types of cam levers can be purchased off the shelf.

The cam lobe 47 can also have a bump or protrusion 48 in it that engages a detent in the cam lobe retainer 50, thereby acting as a simple type of lock. As a result, machine vibration or accidental bumping would not move the lever arm 45. It would have to be deliberately moved out of the locked (or even the unlocked) position.

Similar to the substrate support system in FIGS. 1-3A, plate return springs 30 may press against the front-end rail 4 and the cam pin block 54 in order to allow the middle plate 20 to return to its aligned position when the cam lever 44 is thrown to its unlocked position. A single spring (not shown) could also be placed onto the cam pin 52 in between the front-end rail 4 and the cam pin block 54 in lieu of the plate return springs 30. In order to accommodate this configuration, the cam pin block 54 would be modified to provide clearance for the spring.

In operation, cam lever 44 is rotated to move middle plate 20 to the clamping position. The rotation of cam lever 44 and cam pin 52 causes the translation of cam pin anchor block 54 in a horizontal direction based on the direction of the rotation. For the purposes of this disclosure, translation means the movement of a body from one point of space to another such that every point of the body moves in the same direction and over the same distance without any rotation. Since cam pin block 54 is anchored to the middle plate 20, the movement of cam pin block 54 results in the direct movement of middle plate 20. As a result, when the cam lever 44 is being rotated in a locking direction, the pin apertures in middle plate 20 become misaligned with the pin apertures in the bottom and top plates 18 and 22, thereby causing the portion of each pin 16 adjacent to middle plate 20 to become distorted and locking the pin 16 in position. Since the bottom, middle and top plates are contiguous, no pin material can bulge between them. Therefore, the pin itself is not distorted and remains vertical so that the relationship between pin ends and PCB components is not changed.

Operations such as stenciling solder paste, placing components and soldering leads may then be performed with a stable, level PCB without any distortion or damage to the components on the underside of the board. The cam pin block 54 is simple to manufacture and its cost is estimated at $10.00. Therefore, the new locking system of substrate support system 42 would only cost about $15.00 ($5.00 lever plus $10.00 cam pin block) versus $47.00 (cam, cam slot retainer, cam block housing, and Allen wrench) for the version in FIGS. 1-3A. Additional tooling, such as the Allen wrench, is not required to lock and unlock the system of the present invention.

Figure 6:
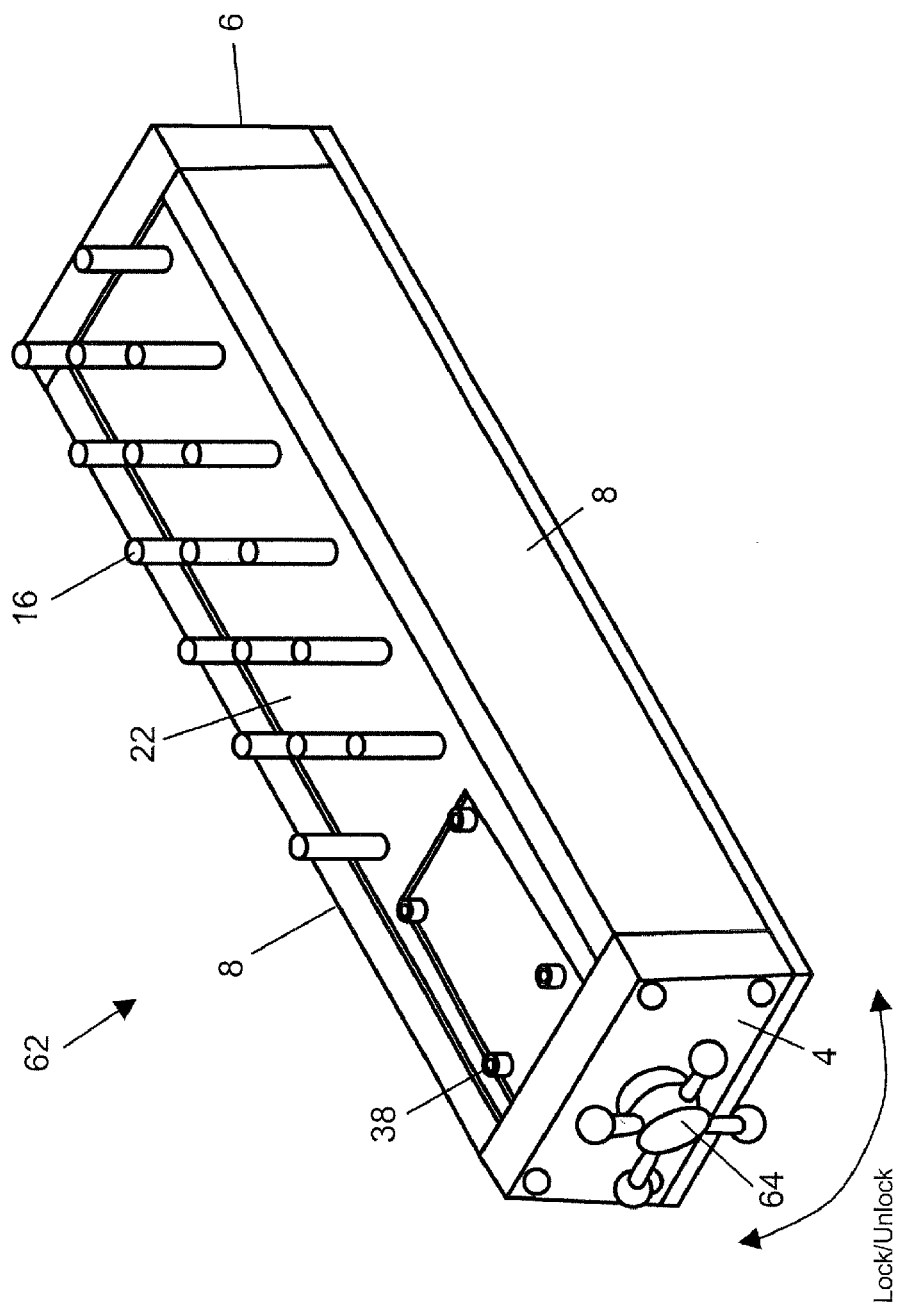
FIG. 6 is a perspective view of another embodiment of a substrate support system in accordance with the present invention.
Figure 7:
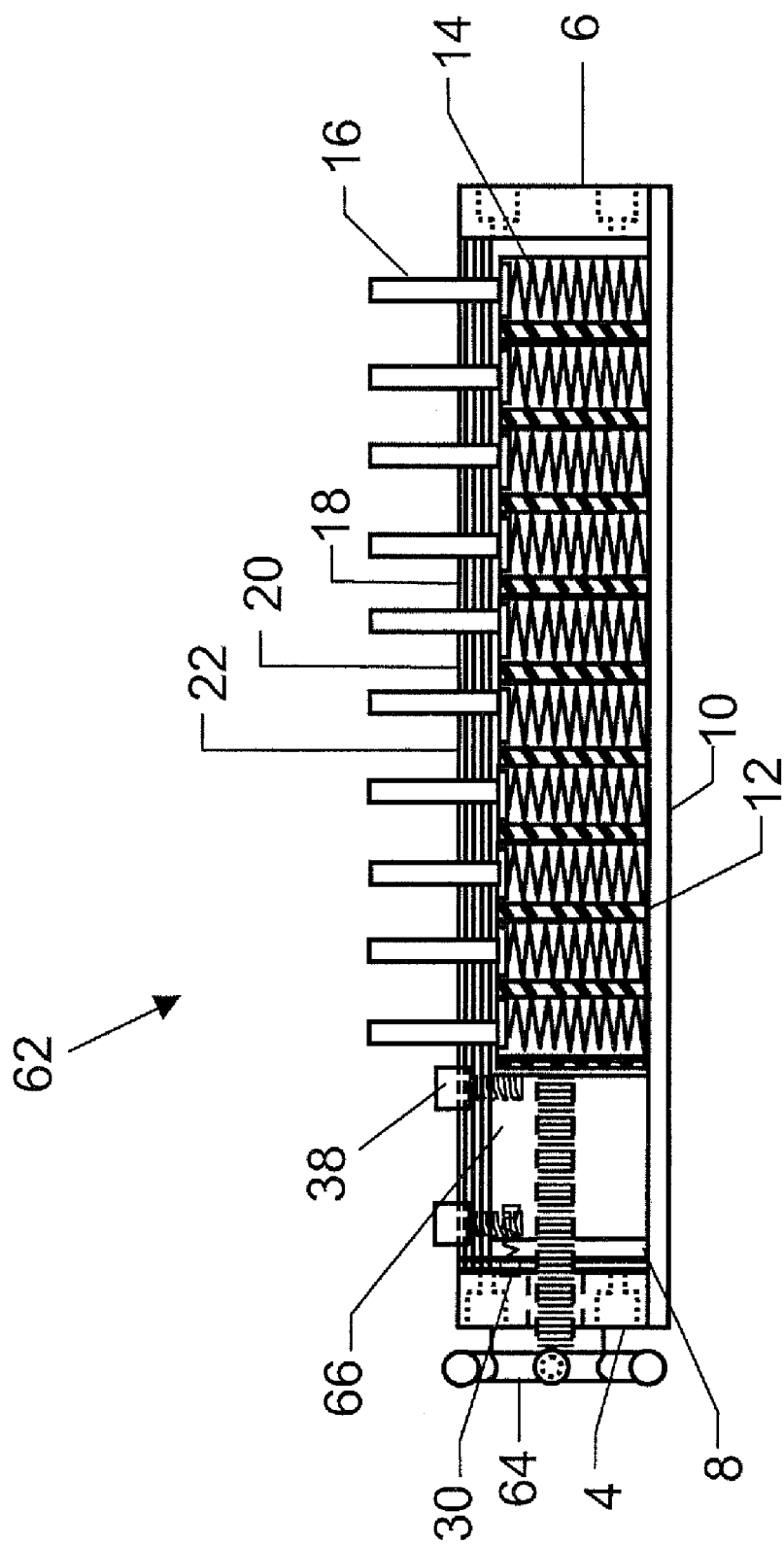
FIG. 7 is a cross-sectional view of the substrate support system of FIG. 6.

An alternative embodiment of the present invention is illustrated in FIGS. 6-7, which show another simplified method for moving the middle plate 20 out of alignment. The substrate support system 62 of FIGS. 6-7 is similar to the substrate support system 42 of FIGS. 4-5. System 62 employs a threaded anchor block 66 that is anchored to the middle plate 20 by any means known in the art, such as threaded fasteners 38. However, instead of using a cam lever, a knob 64 having an attached threaded stud is employed. The threaded stud of knob 64 passes through the front-end rail 4 and screws into the threaded block 66. By tightening (i.e. rotating) the knob 64, a user can move the middle plate 20 out of alignment, thereby locking pins 16 in position.

Although FIGS. 6-7 show a four-armed knob, knob 64 may be designed in a variety of different configurations, including a one-armed knob or a knob with a knurled edge and no arms. However, since quite a bit of pressure has to be applied, having the arms is helpful. As with system 42, no additional tooling is required for substrate support system 62. Although, it is contemplated that a hex socket in the end of the knob with a knurled edge could allow for an Allen wrench to be used to further tighten the knob.

In a preferred embodiment, plate return springs 30 are employed, as with system 42. Preferably, either the two plate return spring design or the single spring on the threaded stud design is applied as discussed above.

The knob and stud can be obtained for as little as $5.00 each, so that system 62 achieves similar savings as system 42.

Figure 8:
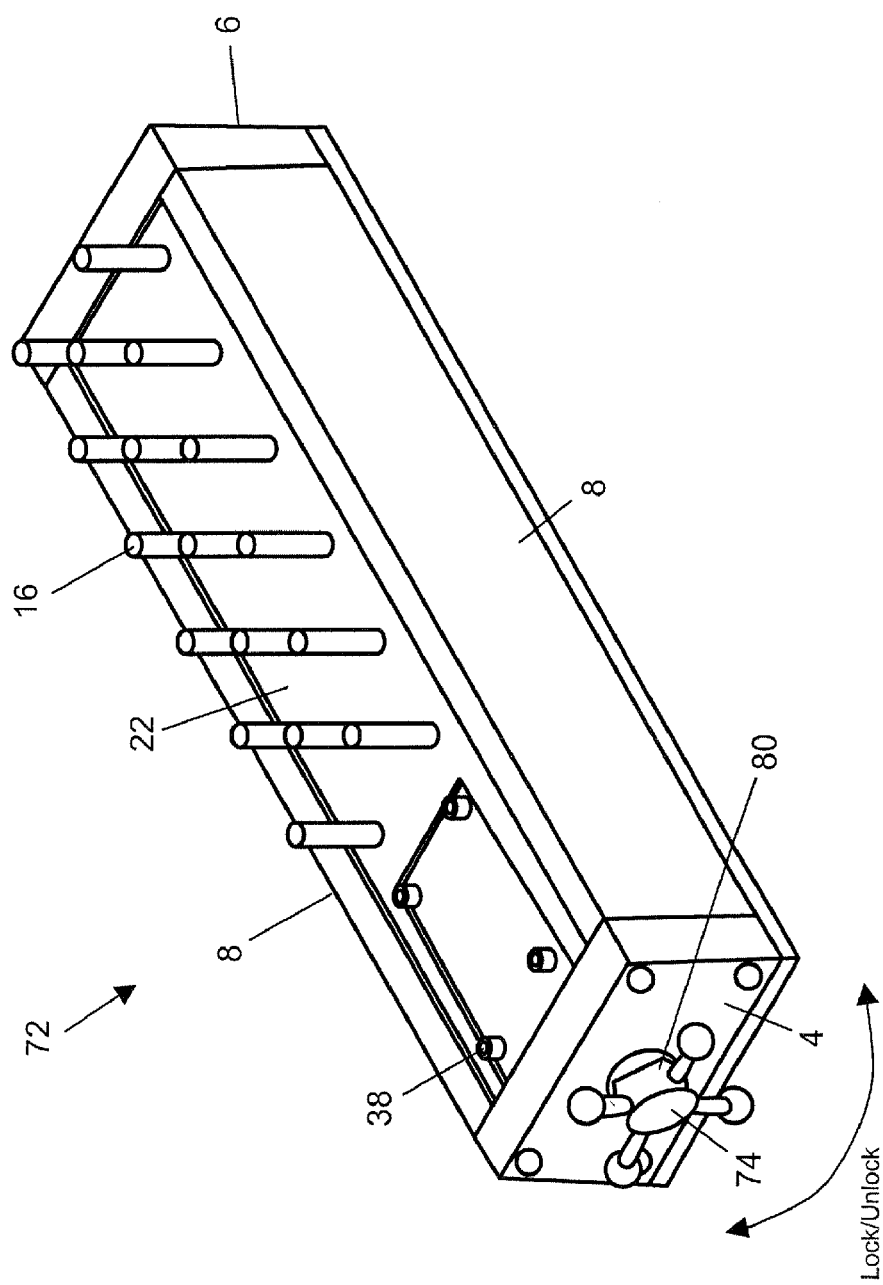
FIG. 8 is a perspective view of yet another embodiment of a substrate support system in accordance with the present invention.
Figure 9:
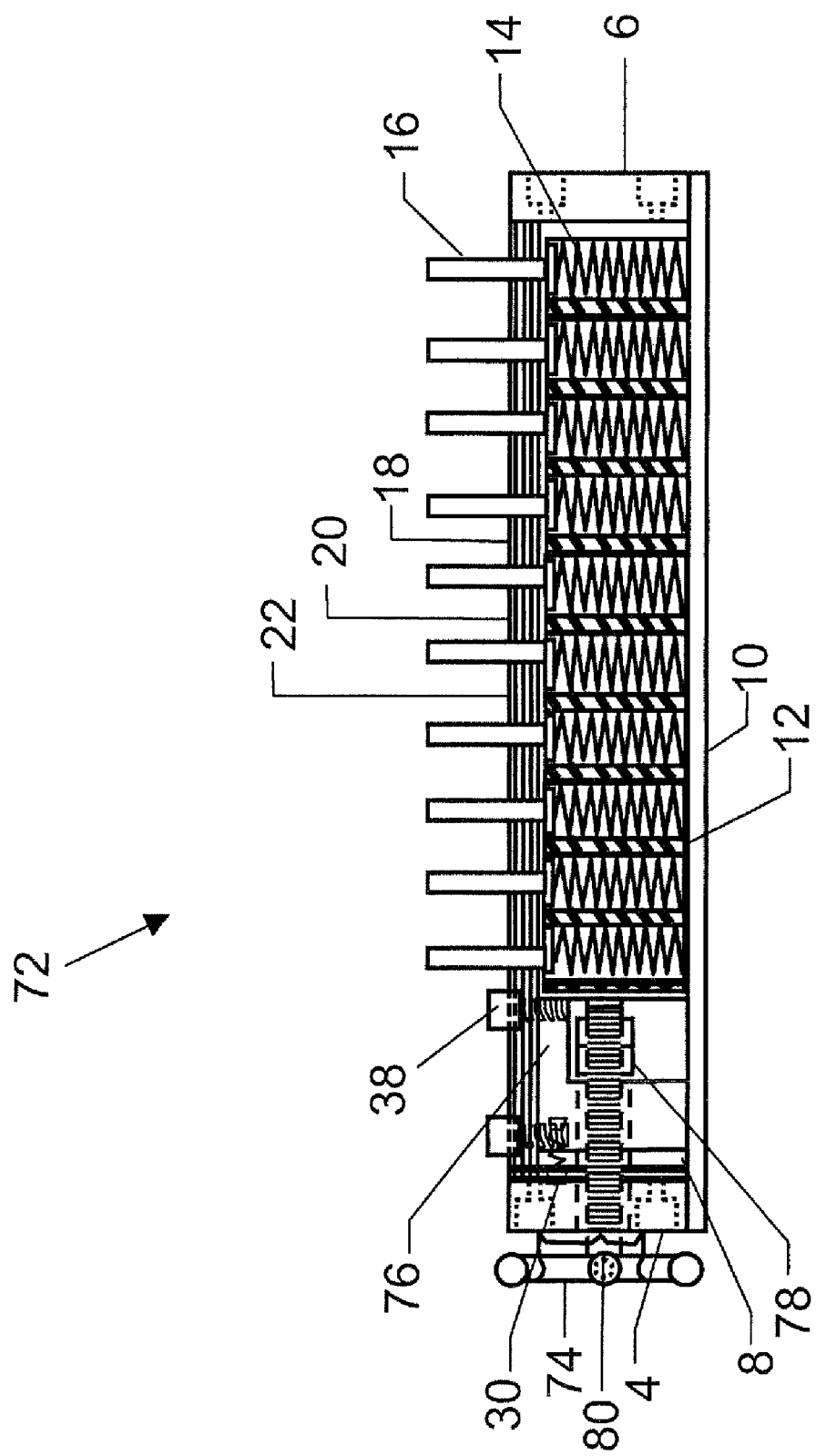
FIG. 9 is a cross-sectional view of the substrate support system of FIG. 8.

Another alternative embodiment of the present invention is illustrated in FIGS. 8-9, which show a substrate support system 72 similar to substrate support systems 42 and 62. Substrate support system 72 comprises a knob 74 having a threaded stud. However, the anchor block 76 through which threaded stud passes is not threaded, and again, two threaded stud retainer nuts 78 are used to lock the threaded stud in position. Anchor block 76 may be secured to the middle plate 20 by any means known in the art, such as threaded fasteners 38. The knob 74 preferably has a companion piece having detents that is anchored to the front-end rail 4. In this configuration, protrusions 80 on the knob 74 can mate with the detents and ramp into a locked position with only slight rotation of the knob 74, as the middle plate 20 clamps the pins 16.

Plate return springs 30 are preferably employed as discussed above with systems 42 and 62, with similar savings resulting. In a preferred embodiment, the ramp on the protrusions 80 is slight, as a large displacement over a short distance would be difficult to achieve since a significant force is required to lock the pins 16.

Figure 10:
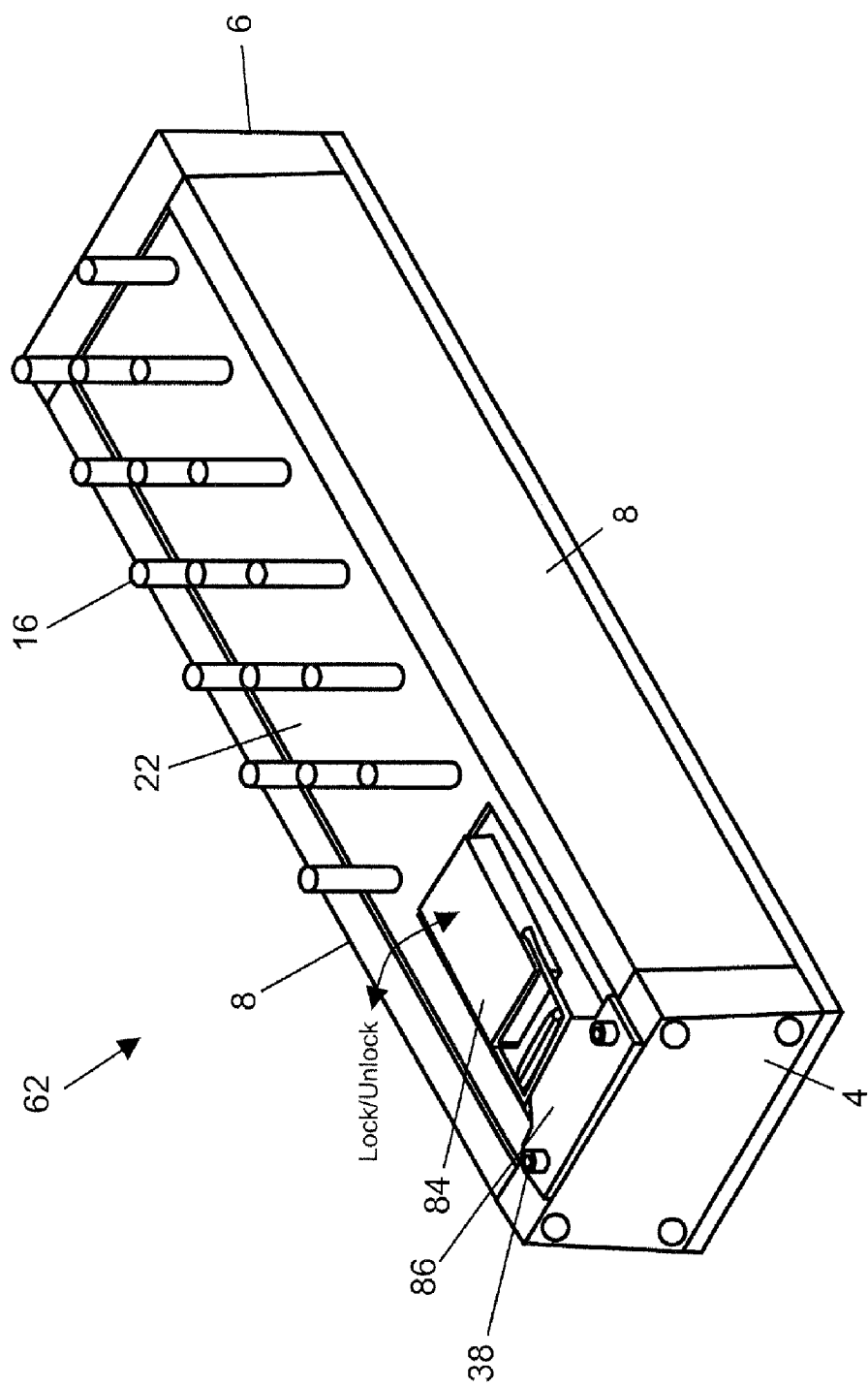
FIG. 10 is a perspective view of yet another embodiment of a substrate support system in accordance with the present invention.
Figure 11:
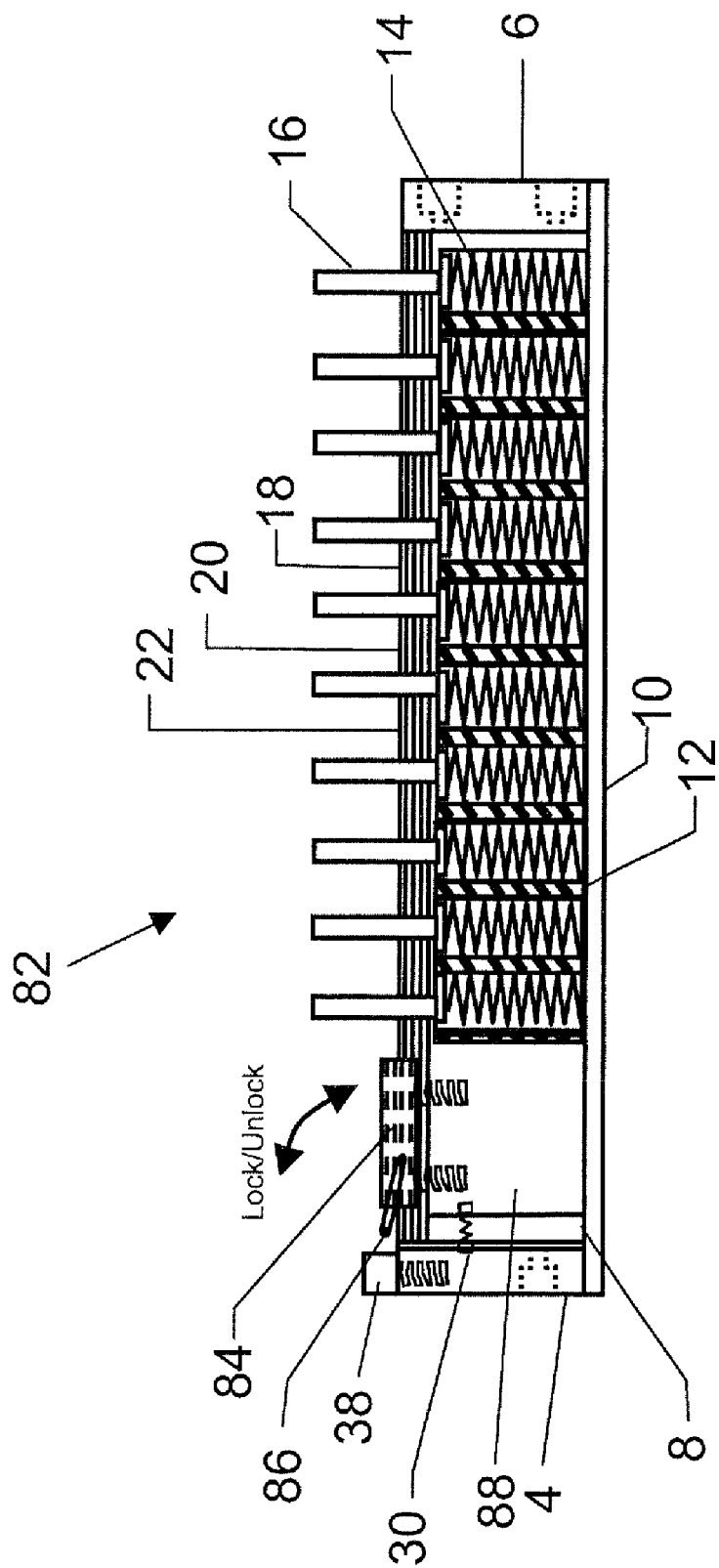
FIG. 11 is a cross-sectional view of the substrate support system of FIG. 10.

Yet another alternative embodiment of the present invention is illustrated in FIGS. 10-11, which show a substrate support system 82 similar to substrate support systems 42, 62 and 72. However, instead of using a cam lever or knob, substrate support system 82 comprises a simple draw latch 84 that is anchored to an anchor block 88, which is anchored to the middle plate 20. These anchoring attachments may be achieved by any means known in the art, such as by threaded fasteners. The clip 86 to which draw latch 84 latches is preferably anchored to the front-end rail 4 using such anchoring means as threaded fasteners 38. Plate return springs 30 are once again preferably utilized, and no additional tooling, such as an Allen wrench, is required.

Substrate support systems 42, 62, 72, and 82 are similar in that they all have a simple yet robust design that utilizes an anchor block, with similar cost savings resulting.

While the substrate support system of U.S. Pat. No. 5,897,108 allows for means to move the middle plate out of alignment and lock the pins into position, the evolution of this invention has called for a more robust system that can repeatedly take higher forces than originally anticipated. Moreover, the present designed-as-built configuration can be further simplified without losing overall performance, repeatability and reliability, resulting in fewer components, no additional tooling and significant cost savings.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention.

What is claimed is:

1. An apparatus for supporting a substrate comprising:
a first plate having a plurality of recess positions formed in a predetermined pattern;
an elastically compressible element positioned in at least some of said first plate recess positions;
a second plate disposed above said first plate and having a plurality of uniform apertures in a pattern corresponding to said predetermined recess pattern;
a third plate overlying said second plate and having a plurality of uniform apertures in a pattern corresponding to said second plate aperture pattern;
a fourth plate overlying said third plate and having a plurality of uniform apertures in a pattern corresponding to said second plate aperture pattern;
a plurality of deformable pins for insertion into at least some of said apertures in said second, third and fourth plates when said apertures are aligned, said pins having cross sections corresponding to said second, third and fourth plate apertures;
an anchor block secured to said third plate; and
means for moving said third plate between an aligned position in which said apertures in said second, third and fourth plates are aligned and a clamping position in which said third plate is not aligned with said second and fourth plate apertures, wherein said means for moving said third plate is configured to move said third plate to said clamping position by translating said anchor block in a horizontal direction.

2. The apparatus of claim 1, wherein said apertures in said second, third and fourth plates are substantially equal in diameter and smaller in diameter than said elastically compressible element.

3. The apparatus of claim 1, further comprising a front-end rail secured to said first plate between said anchor block and the distal end of said means for moving said third plate.

4. The apparatus of claim 3, wherein said means for moving said third plate comprises a cam lever having a lever arm and a cam lobe rotatably coupled to a threaded pin that passes through said front-end rail and said anchor block and is anchored to said anchor block, the rotation of said cam lever in a particular direction causing the translation of said anchor block and said third plate in a horizontal direction.

5. The apparatus of claim 4, wherein said threaded pin passes through a threaded hole in said anchor block.

6. The apparatus of claim 5, further comprising means for preventing said cam lever from rotating beyond a certain point.

7. The apparatus of claim 6, wherein said means for preventing said cam lever from rotating beyond a certain point comprises a cam lobe retainer disposed in a fixed position between said cam lobe and said front-end rail.

8. The apparatus of claim 6, wherein said cam lobe comprises a protrusion that is configured to engage a detent in said cam lobe retainer in order to lock said lever arm in place.

9. The apparatus of claim 4, wherein said threaded pin passes through a non-threaded hole in said anchor block.

10. The apparatus of claim 9, further comprising two cam pin retainer nuts applied at the end of said threaded pin such that said retainer nuts secure said threaded pin at a specific position.

11. The apparatus of claim 4, wherein said cam lever is configured to be locked in position when said lever arm is rotated to a position substantially perpendicular to said first, second, third, and fourth plates.

12. The apparatus of claim 4, wherein said cam lever further comprises a spring-loaded lock button that prevents said lever arm from rotating with respect to said threaded pin when engaged.

13. The apparatus of claim 4, further comprising a plate return spring disposed between said front-end rail and said anchor block, wherein said plate return spring is configured to press against said front-end rail and said anchor block in order to allow said third plate to return to its aligned position when said cam lever is in an unlocked position.

14. The apparatus of claim 4, wherein said plurality of recess positions is formed by a plurality of insert plates configured to be disposed between each elastically compressible element.

15. The apparatus of claim 3, wherein said means for moving said third plate comprises a knob having a threaded stud that passes through said front-end rail and said anchor block and is anchored to said anchor block, the rotation of said knob in a particular direction causing the translation of said anchor block and said third plate in a horizontal direction.

16. The apparatus of claim 15, wherein said threaded stud passes through a threaded hole in said anchor block.

17. The apparatus of claim 15, wherein said threaded stud passes through a non-threaded hole in said anchor block.

18. The apparatus of claim 17, further comprising two threaded stud retainer nuts applied at the end of said threaded stud such that said retainer nuts secure said threaded stud at a specific position.

19. The apparatus of claim 17, wherein said knob comprises ramping protrusions configured to engage corresponding detents on a companion piece secured to said front-end rail.

20. The apparatus of claim 15, further comprising a plate return spring disposed between said front-end rail and said anchor block, wherein said plate return spring is configured to press against said front-end rail and said anchor block in order to allow said third plate to return to its aligned position when said knob is in an unlocked position.

21. The apparatus of claim 15, wherein said plurality of recess positions is formed by a plurality of insert plates configured to be disposed between each elastically compressible element.

22. The apparatus of claim 3, wherein said means for moving said third plate comprises a draw latch secured to said anchor block and configured to engage and lock onto a clip secured to said front-end rail, the locking of said draw latch causing the translation of said anchor block and said third plate in a horizontal direction.

23. The apparatus of claim 22, further comprising a plate return spring disposed between said front-end rail and said anchor block, wherein said plate return spring is configured to press against said front-end rail and said anchor block in order to allow said third plate to return to its aligned position when said draw latch is in an unlocked position.

24. The apparatus of claim 22, wherein said plurality of recess positions is formed by a plurality of insert plates configured to be disposed between each elastically compressible element.

\* \* \* \* \*